(12) United States Patent
Cheng et al.

(10) Patent No.: US 9,915,846 B2
(45) Date of Patent: Mar. 13, 2018

(54) ARRAY SUBSTRATE AND DISPLAY DEVICE

(71) Applicant: Boe Technology Group Co., Ltd., Beijing (CN)

(72) Inventors: Hongfei Cheng, Beijing (CN); Jianbo Xian, Beijing (CN); Yongda Ma, Beijing (CN); Xingchen Shangguan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/913,259

(22) PCT Filed: Aug. 20, 2015

(86) PCT No.: PCT/CN2015/087696
§ 371 (c)(1),
(2) Date: Feb. 19, 2016

(87) PCT Pub. No.: WO2016/155210
PCT Pub. Date: Oct. 6, 2016

(65) Prior Publication Data
US 2017/0045792 A1 Feb. 16, 2017

(30) Foreign Application Priority Data
Mar. 27, 2015 (CN) .................. 2015 2 0182156 U

(51) Int. Cl.
*H01L 27/146* (2006.01)
*G02F 1/1362* (2006.01)
(Continued)

(52) U.S. Cl.
CPC ...... *G02F 1/136286* (2013.01); *G02F 1/1362* (2013.01); *G02F 1/134309* (2013.01);
(Continued)

(58) Field of Classification Search
CPC H01L 27/124; H01L 27/14603; H01L 27/146
See application file for complete search history.

(56) References Cited

U.S. PATENT DOCUMENTS

2015/0268522 A1* 9/2015 Park .................. G02F 1/133707
349/122

FOREIGN PATENT DOCUMENTS

| CN | 1677206 | 10/2005 |
|----|---------|---------|
| CN | 101604102 | 12/2009 |

(Continued)

OTHER PUBLICATIONS

International Search Report and Written Opinion from PCT/CN15/87696 dated Dec. 18, 2015.

*Primary Examiner* — Jae Lee
(74) *Attorney, Agent, or Firm* — Calfee, Halter & Griswold LLP

(57) ABSTRACT

An array substrate and a display device belonging to the field of display technology. The array substrate comprises a plurality of gate lines, a plurality of data lines which intersect the plurality of gate lines, and a plurality of pixels units comprised of electrodes defined by neighboring gate lines and neighboring data lines. The array substrate includes a plurality of common electrode lines extending in a gate line direction. Each of the common electrode lines comprises a plurality of branches extending in a data line direction. The array substrate can shield an electric field formed between the data lines and the pixel electrodes, so that a problem of light leakage in the array substrate is solved.

8 Claims, 7 Drawing Sheets

(51) Int. Cl.
*G02F 1/1343* (2006.01)
*H01L 27/12* (2006.01)
(52) U.S. Cl.
CPC ...... *H01L 27/124* (2013.01); *G02F 2201/121* (2013.01); *G02F 2201/123* (2013.01)

(56) References Cited

FOREIGN PATENT DOCUMENTS

| | | |
|---|---|---|
| CN | 102054833 | 5/2011 |
| CN | 102088025 | 6/2011 |
| CN | 102722058 | 10/2012 |
| CN | 102890373 | 1/2013 |
| CN | 204462602 | 7/2015 |
| KR | 20130026375 | 3/2013 |

* cited by examiner

ARRAY SUBSTRATE AND DISPLAY DEVICE

RELATED APPLICATIONS

The present application is the U.S. national phase entry of PCT/CN2015/087696 with an International filing date of Aug. 20, 2015, which claims the benefit of Chinese Application No. 201520182156.6, filed Mar. 27, 2015, the entire disclosures of which are incorporated herein by reference.

FIELD OF THE INVENTION

The present invention relates to the field of display technology, and particularly to an array substrate and a display device.

BACKGROUND OF THE INVENTION

With the development of technology for fabricating a display, liquid crystal display technology has developed rapidly and gradually replaced the conventional CRT display to become mainstream for flat panel display in the future. In the field of liquid crystal display technology, TFT-LCD (Thin Film Transistor Liquid Crystal Display) has been widely applied to TV, computer, mobile phone, or the like due to its advantages of large size, high degree of integration, rich functionality, flexible process, and low cost.

A display panel is generally formed by assembling an array substrate (i.e., a TFT substrate) and a color film substrate (i.e., a CF substrate) and injecting liquid crystal therebetween. Generally, on the array substrate, a pattern of gate lines (i.e., scan lines), a pattern of data lines (i.e., signal lines), a pattern of TFT, a pattern of via holes, a pattern of pixel electrodes (i.e., display electrodes), and a pattern of common electrode lines are formed. A plurality of gate lines and a plurality of data lines intersect to define several pixel units.

In the existing array substrate, data signal in the data lines and an electric field formed between pixel electrodes may interference orientation of liquid crystal molecules in regions between the data lines and pixel electrodes, so that the display panel is subject to light leakage.

SUMMARY OF THE INVENTION

The present invention intends to alleviate or eliminate one or more technical problems in the existing array substrate. In particular, embodiments of the present invention provide an array substrate and a display device which can effectively avoid light leakage in the array substrate.

To solve the technical problem, the present invention provides an array substrate, comprising a plurality of gate lines, a plurality of data lines which intersect the plurality of gate lines, and a plurality of pixels units defined by neighboring gate lines and neighboring data lines, each pixel unit comprises a pixel electrode;

the array substrate further comprises a plurality of common electrode lines extending in a gate line direction, each of the common electrode lines comprises a plurality of branches extending in a data line direction;

each branch corresponds to one of the data lines and at least one pixel electrode, a projection of each branch on the substrate at least partially overlaps a projection of the data line to which the branch corresponds on the substrate, and partially overlaps a projection of the pixel electrode to which the branch corresponds on the substrate.

For example, a projection of at least one of the branches on the substrate partially overlaps projections of two neighboring pixel electrodes in a same row on the substrate, respectively, and completely overlaps a projection of the data line between said two neighboring pixel electrodes on the substrate.

For example, a projection of each branch on the substrate partially overlaps a projection of the pixel electrode to which the branch corresponds on the substrate, and partially overlaps a projection of the data line to which the branch corresponds on the substrate.

For example, a layer in which the pixel electrodes lie is located above the layer in which the data lines lie, and a layer in which the common electrode lines lie is located below a layer in which the data lines lie.

For example, the common electrode lines and the gate lines are arranged in a same layer and made from a same material.

For example, a layer in which the data lines lie is located above a layer in which the gate lines lie, and a layer in which the common electrode lines lie is located above a layer in which the data lines lie.

For example, a layer in which the pixel electrodes lie is located above the layer in which the data lines lie, and the layer in which the common electrode lines lie is located between the layer in which the pixel electrodes lie and the layer in which the data lines lie.

For example, the layer in which the pixel electrodes lie is located above the layer in which the data lines lie, and the layer in which the common electrode lines lie is located above the layer in which the pixel electrodes lie.

For example, two neighboring common electrode lines are connected into an integral structure by respective branch of one the two common electrode lines which extends in the data line direction.

For example, a layer in which the pixel electrodes lie is located above a layer in which the data lines lie, a layer in which the gate lines lie is located below the layer in which the data lines lie, and a layer in which the common electrode lines lie is located below the layer in which the gate lines lie.

For example, two neighboring common electrode lines are connected into an integral structure by respective branch of one the two common electrode lines which extends in the data line direction.

To solve the technical problem, the present invention provides a display device comprising the above-mentioned array substrate.

The present invention has the following beneficial effects.

In the present invention, the array substrate comprises a plurality of common electrode lines, each of the common electrode lines comprises a plurality of branches extending in a data line direction, each branch corresponds to one of the data lines and at least one pixel electrode, a projection of each branch on the substrate at least partially overlaps a projection of the data line to which the branch corresponds on the substrate, and partially overlaps a projection of the pixel electrode to which the branch corresponds on the substrate. The array substrate can shield an electric field formed between the data lines and the pixel electrodes, so that interference on orientation of liquid crystal molecules in regions between the data lines and the pixel electrodes due to the electric field formed between the data lines and the pixel electrodes can be avoided, and light leakage in regions between the data lines and pixel electrodes can be blocked.

The display device in the present invention comprises the above-mentioned array substrate and has excellent display effect.

DETAILED DESCRIPTION OF THE INVENTION

Figure 1:
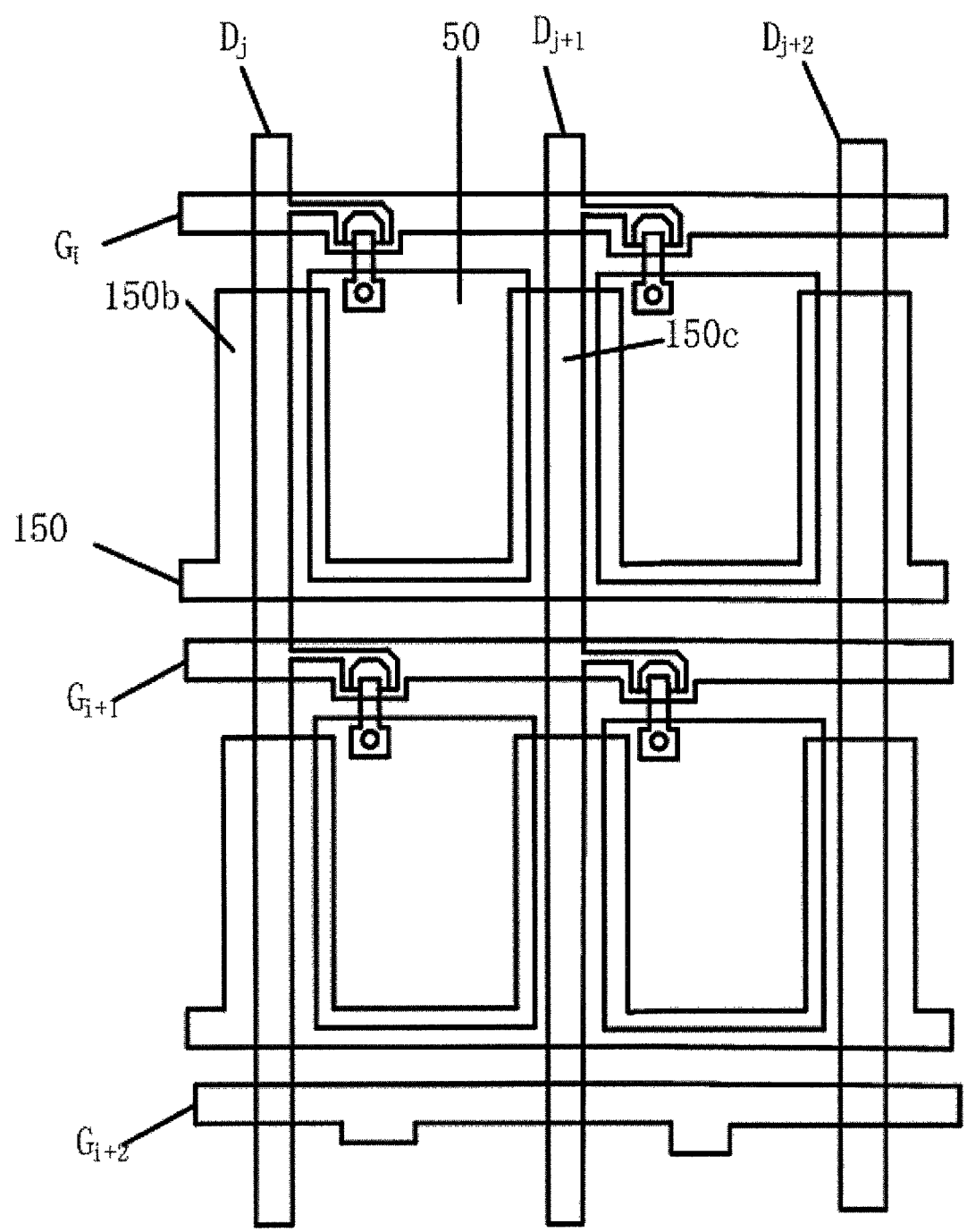
FIG. 1 is a plan view for an array substrate in embodiments 1-3 of the present invention.

The present invention will be described in details hereinafter by reference to drawings and embodiments, so that technical solutions of the present invention can be better understood by a skilled in the art.

The present invention provides an array substrate, comprising a plurality of gate lines, a plurality of data lines which intersect the plurality of gate lines, a plurality of common electrode lines, and a plurality of pixels units defined by neighboring gate lines and neighboring data lines, each pixel unit comprises a pixel electrode, the array substrate further comprises a plurality of common electrode lines extending in a gate line direction, each of the common electrode lines comprises a plurality of branches extending in a data line direction; each branch corresponds to one of the data lines and at least one pixel electrode, a projection of each branch on the substrate at least partially overlaps a projection of the data line to which the branch corresponds on the substrate, and partially overlaps a projection of the pixel electrode to which the branch corresponds on the substrate.

In particular, description is made by reference to the following embodiments.

Reference numerals:

Gi, Gi+1, Gi+2 gate line; Dj, Dj+1, Dj+2 data line; 150 common electrode line; 150b/150c branch; 1 substrate; 5 gate insulating layer; 15 passivation layer; 25 first insulating layer; 35 second insulating layer; 45 third insulating layer; 10 gate; 20 active layer; 31 source; 32 drain; 50 pixel electrode; 40 via hole.

Embodiment 1

As shown in FIG. 1, the present embodiment provides an array substrate. At least one branch of each of the common electrode lines 150 on the array substrate corresponds to two neighboring pixel electrode 50 in a same row and a data line between these two pixel electrodes 50. For example, a branch 150c of one of the common electrode lines 150 corresponds to a data line Dj+1 and two pixel electrodes 50 at both sides of the data line Dj+1. In this case, a projection of the branch on the substrate 1 partially overlaps projections of these two pixel electrodes 50 on the substrate 1, respectively, and completely overlaps a projection of the data line between these two pixel electrodes 50 on the substrate 1.

In an embodiment of the present invention, the expression "the projection of the branch of one of the common electrode lines on the substrate 1 completely overlaps the projection of the data line on the substrate 1" indicates that, in a gate line direction, the projection of the branch of one of the common electrode lines on the substrate 1 completely covers the projection of the data line on the substrate 1.

Figure 2:
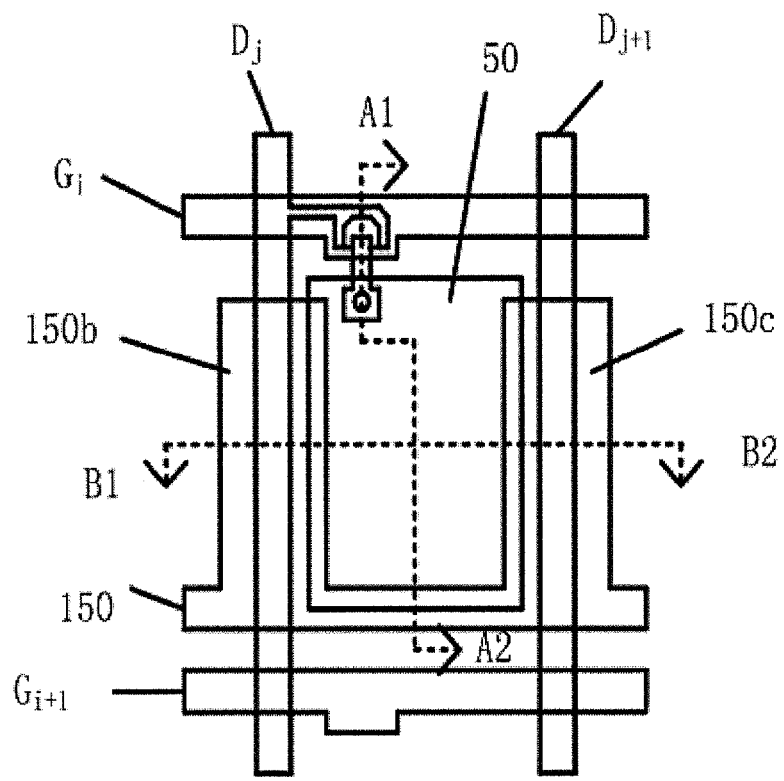
FIG. 2 is a schematic view for a pixel unit in the array substrate of embodiments 1-3.

In particular, as shown in FIG. 2, a pixel unit is defined by the $j^{th}$ column of data line Dj and the neighboring $(j+1)^{th}$ column of data line Dj+1, and the $i^{th}$ row of gate line Gi and the neighboring $(i+1)^{th}$ row of gate line Gi+1. The common electrode lines 150 correspond to the pixel unit. Projections of branches 150b, 150c of one of the common electrode lines 150 completely overlap projections of the data lines Dj, Dj+1 on the substrate 1 respectively, and partially overlap projections of the pixel electrodes 50 on the substrate 1 projection respectively. The projection of the branch 150b on the substrate partially overlaps a projection of a left neighboring pixel electrode in a same row as the pixel electrode 50 on the substrate (now shown in FIG. 2). The projection of the branch 150c on the substrate partially overlaps a projection of a right neighboring pixel electrode in a same row as the pixel electrode 50 on the substrate (now shown in FIG. 2).

Figure 3:
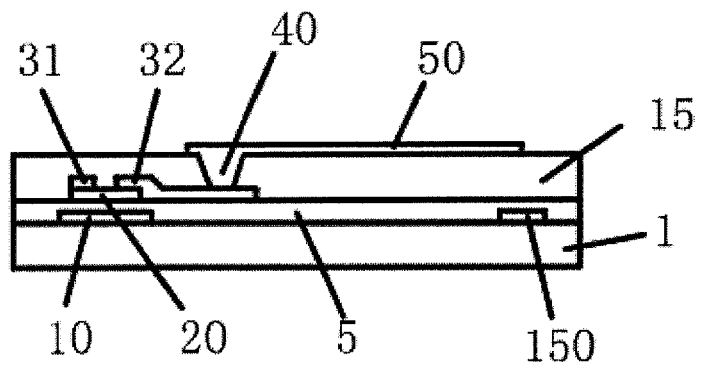
FIG. 3 is a cross-sectional view corresponding to A1-A2 in FIG. 2 of embodiment 1.
Figure 4:
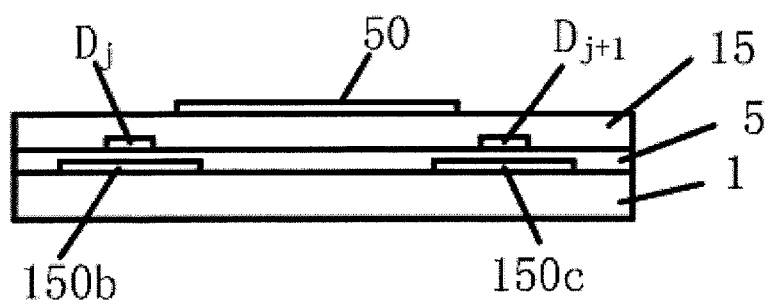
FIG. 4 is a cross-sectional view corresponding to B1-B2 in FIG. 2 of embodiment 1.

In this embodiment, each pixel unit comprises a thin film transistor, wherein a source 31 of the thin film transistor is connected with the data lines, a drain 32 is connected with the pixel electrodes 50, and a gate 10 is connected with the gate lines. As shown in FIG. 3 and FIG. 4, the array substrate comprises the following layers. The common electrode lines 150 are arranged in a same layer as the gate lines and the gate 10 on the substrate 1. A gate insulating layer 5 covers the gate lines, the gate 10, and the common electrode lines 150. An active layer 20 is arranged on the gate insulating layer 5. The source 31 and the drain 32 are arranged on the active layer 20. A passivation layer 15 is arranged on the source 31 and the drain 32. A pixel electrode 50 is arranged on the passivation layer 15. The pixel electrode 50 is connected with the drain 32 of the thin film transistor by means of a via hole 40. In this embodiment, the via hole is arranged in the passivation layer 15, and partially exposes the drain 32 of the thin film transistor. As can be seen, the branches 150b, 150c of one of the common electrode lines 150 are located below a layer in which the data lines Dj, Dj+1 lie.

In the present embodiment, the array substrate comprises a plurality of common electrode lines 150. Each of the common electrode lines 150 comprises a plurality of branches 150b, 150c extending in a data line direction. The branches 150b, 150c correspond to one of the data lines Dj, Dj+1 respectively, and correspond to at least one pixel electrode 50. Projections of the branches 150b, 150c on the substrate 1 completely overlap projections of the data lines to which the branches Dj, Dj+1 correspond on the substrate 1 respectively, and partially overlap a projection of the pixel electrode 50 to which the branches correspond on the substrate 1. The array substrate can shield an electric field formed between the data lines and the pixel electrode 50, so that interference on orientation of liquid crystal molecules in regions between the data lines and the pixel electrodes 50 due to the electric field formed between the data lines and the pixel electrodes 50 can be avoided, and light leakage in regions between the data lines and pixel electrodes 50 can be blocked.

Figure 5:
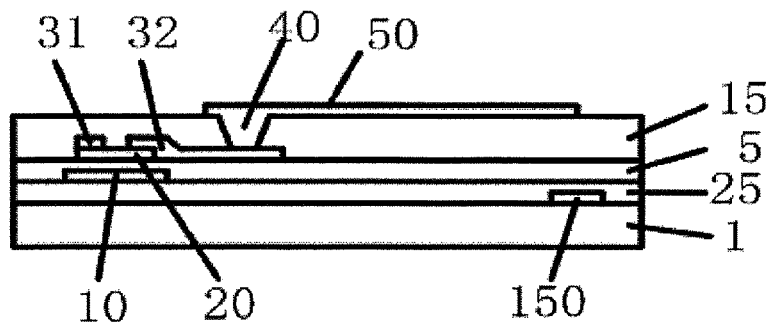
FIG. 5 is another cross-sectional view corresponding to A1-A2 in FIG. 2 of embodiment 1.
Figure 6:
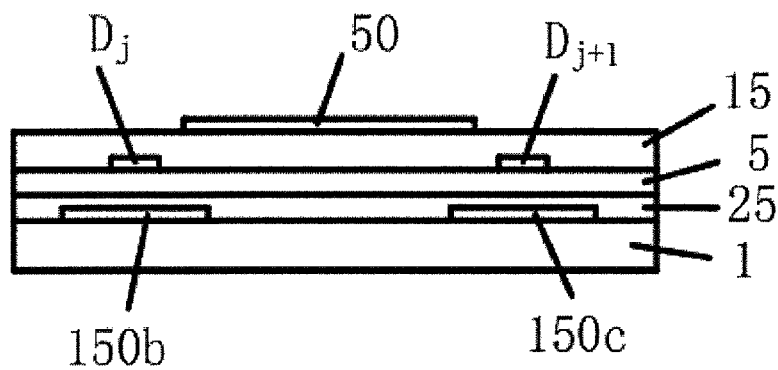
FIG. 6 is another cross-sectional view corresponding to B1-B2 in FIG. 2 of embodiment 1.

It is noted that in this embodiment, it is also possible that the common electrode lines 150 and the gate lines are not arranged in a same layer, as long as a layer in which the common electrode lines 150 lie is located below a layer in which the data lines lie. In case the common electrode lines 150 and the gate lines are arranged in a same layer, they can be made from a same material and formed by a patterning process. Of course, as shown in FIGS. 5-6, the common electrode lines 150 can further be located below a layer in which the gate lines lie. In this case, the common electrode lines 150 are spaced apart from the first insulating layer 25 by a layer in which the gate lines lie, and a pattern for the gate lines and the common electrode lines 150 are formed d by two patterning processes. It is further noted that in this embodiment the passivation layer 15 can be absent between the pixel electrode 50 and a layer in which the source 31 and the drain 32 lie, while the pixel electrode 50 is arranged on the gate insulating layer 5. In this case, the pixel electrode 50 can be directly connected with the drain 32.

Embodiment 2

The present embodiment provides an array substrate, which has a structure substantially identical to that of embodiment 1. The difference lies in that, in the array substrate of the present embodiment, the layer in which the common electrode lines 150 lie is located between a layer in which the data lines lie and a layer in which the pixel electrode 50 lies.

Figure 7:
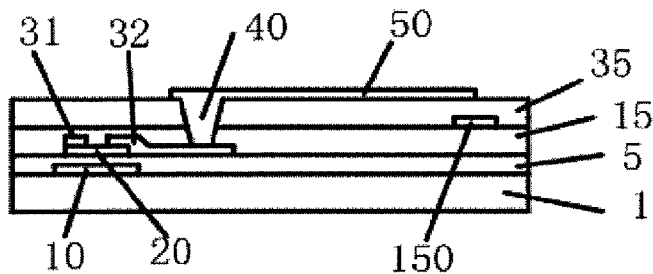
FIG. 7 is another cross-sectional view corresponding to A1-A2 in FIG. 2 of embodiment 2.
Figure 8:
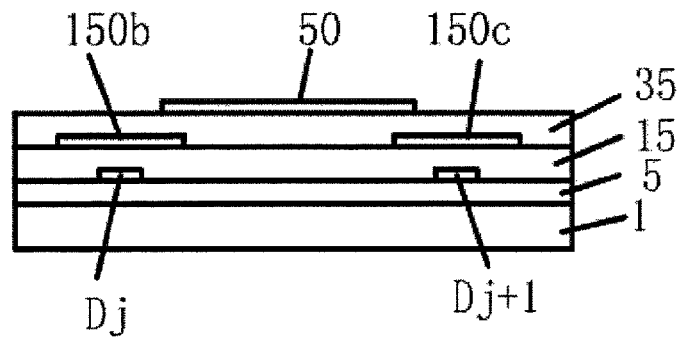
FIG. 8 is another cross-sectional view corresponding to B1-B2 in FIG. 2 of embodiment 2.

In particular, as shown in FIGS. 7-8, the branches 150b, 150c of one of the common electrode lines 150 is located between the layer in which the data lines Dj, Dj+1 lie and the layer in which the pixel electrode 50 lies. Projections of the branches 150b, 150c on the substrate 1 completely overlap projections of the data lines Dj, Dj+1 on the substrate 1, respectively. Projections of the branches 150b, 150c on the substrate 1 partially overlap a projection of the pixel electrode 50 on the substrate 1, respectively. In this case, the layer in which the common electrode lines 150 lie is spaced apart from a layer in which the pixel electrode 510 lies by a second insulating layer 35, and the common electrode lines 150 are arranged on the passivation layer 15.

The other aspects of the array substrate in the present embodiment are identical or similar with those of embodiment 1, which are not described in details herein.

Embodiment 3

The present embodiment provides an array substrate, which has a substrate substantially identical to that of embodiment 1. The difference lies in that, in the array substrate of the present embodiment, the layer in which the common electrode lines 150 lie is located above the layer in which the pixel electrode 50 lies.

Figure 9:
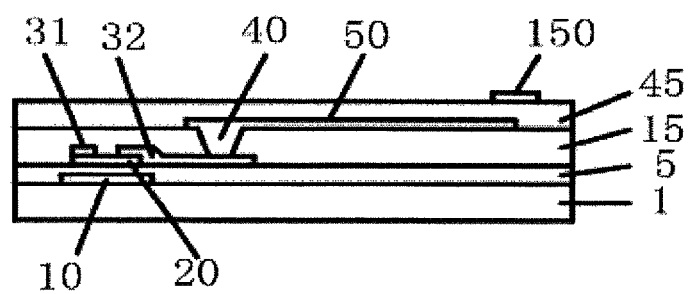
FIG. 9 is another cross-sectional view corresponding to A1-A2 in FIG. 2 of embodiment 3.
Figure 10:
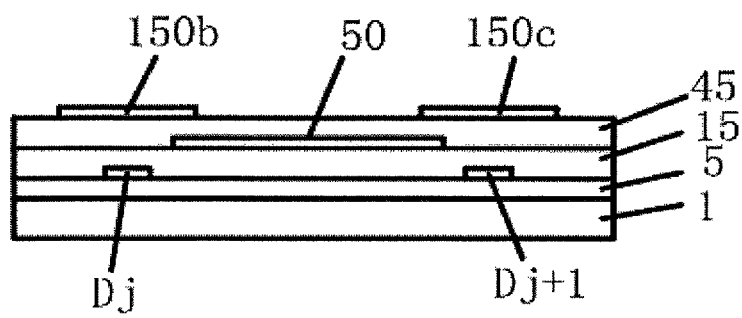
FIG. 10 is another cross-sectional view corresponding to B1-B2 in FIG. 2 of embodiment 3.

In particular, as shown in FIGS. 9-10, the branches 150b, 150c of one of the common electrode lines 150 are arranged over the layer in which the pixel electrode 50 lies. Projections of the branches 150b, 150c on the substrate 1 completely overlap projections of the data lines Dj, Dj+1 on the substrate 1, respectively. Projections of the branches 150b, 150c on the substrate 1 partially overlap the projection of the pixel electrode 50 on the substrate 1, respectively. In this case, the layer in which the common electrode lines 150 lie is spaced apart from the layer in which the pixel electrode 50 lies by a third insulating layer 45.

The other aspects of the array substrate in the present embodiment are identical or similar with those of embodiment 1, which are not described in details herein.

Embodiment 4

Figure 11:
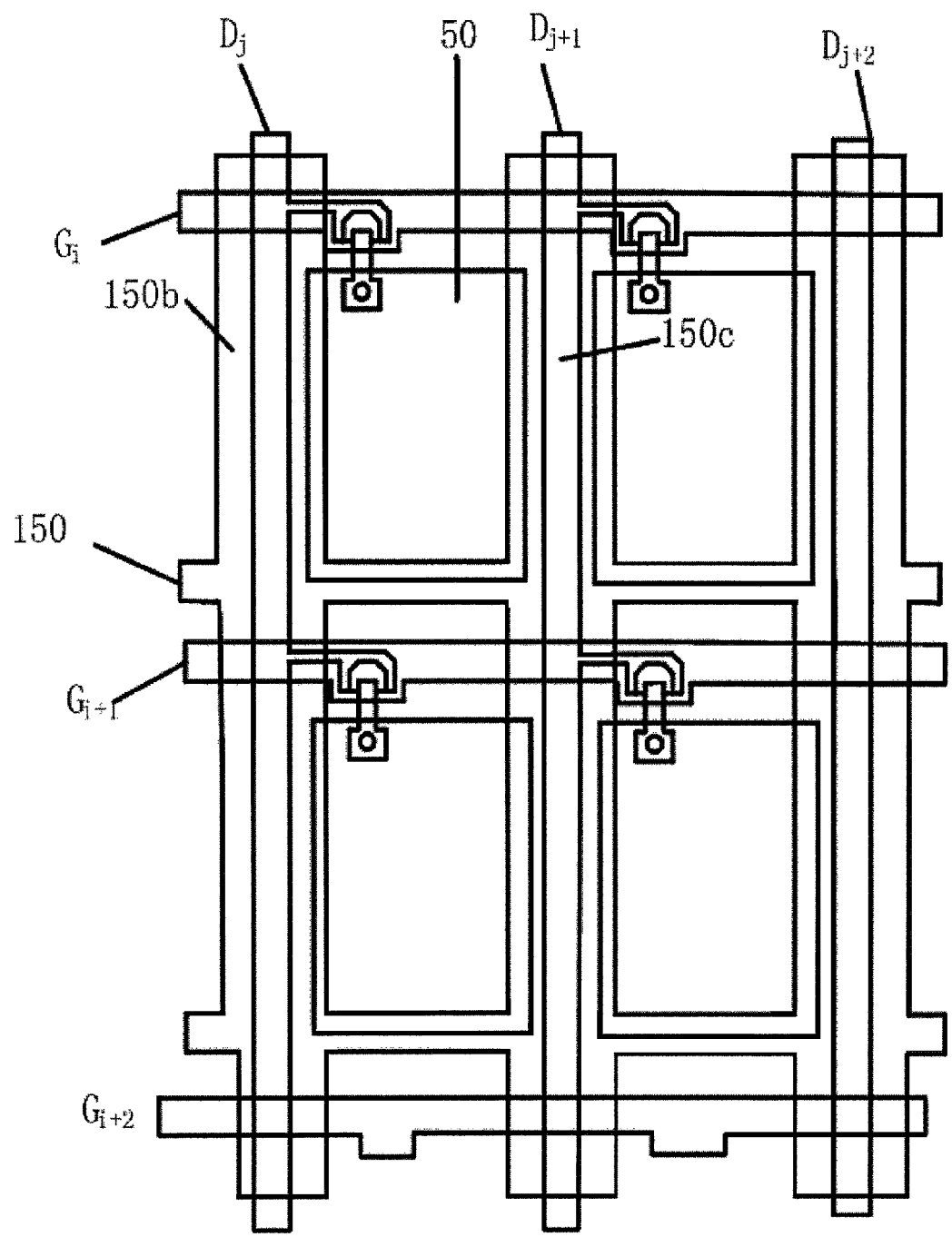
FIG. 11 is a plan view for an array substrate in embodiment 4 of the present invention.

As shown in FIG. 11, the present embodiment provides an array substrate, in which the gate lines and the common electrode lines 150 are not arranged in a same layer. The array substrate of the present embodiment differs from that of embodiments 1-3 in that, two neighboring common electrode lines are connected into an integral structure by respective branch of one the two common electrode lines which extends in the data line direction.

The other aspects of the array substrate in the present embodiment are identical or similar with those of embodiments 1-3, which are not described in details herein.

Embodiment 5

The present embodiment provides an array substrate, wherein the projection of each branch for each of the common electrode lines 150 on the substrate 1 partially overlaps the projection of one of the pixel electrodes 50 to which the branch corresponds on the substrate 1, and partially overlaps the projection of the data line to which the branch corresponds on the substrate 1.

Figure 12:
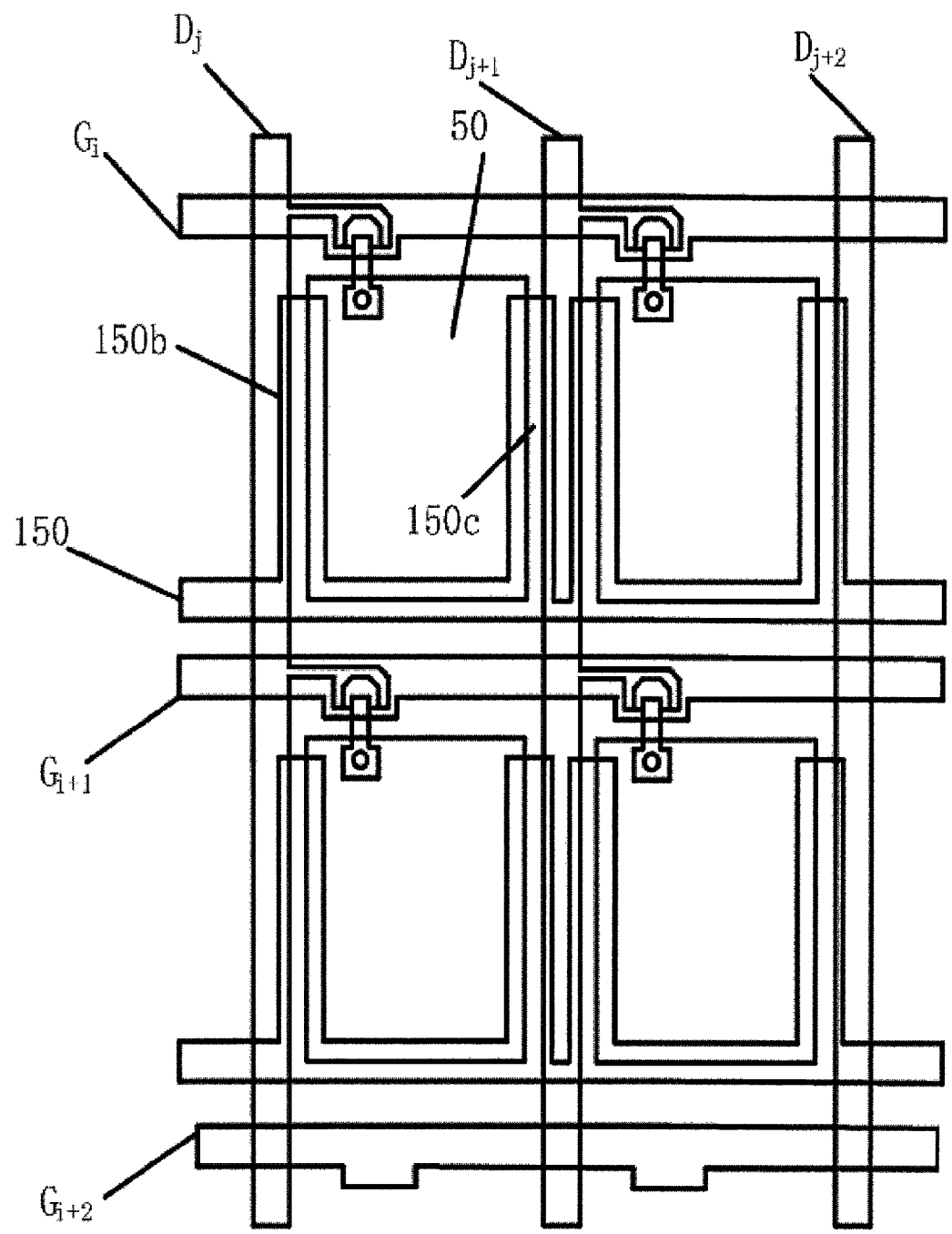
FIG. 12 is a plan view for an array substrate in embodiment 5 of the present invention.

In particular, as shown in FIG. 12, branches 150b, 150c of one of the common electrode lines 150 correspond to the data lines Dj, Dj+1 respectively, and correspond to a same pixel electrode 50 respectively. Projections of branches 150b, 150c of one of the common electrode lines 150 on the substrate 1 partially overlap projections of the data lines Dj, Dj+1 on the substrate 1 respectively, and partially overlap the projection of the pixel electrode 50 on the substrate 1.

Figure 13:
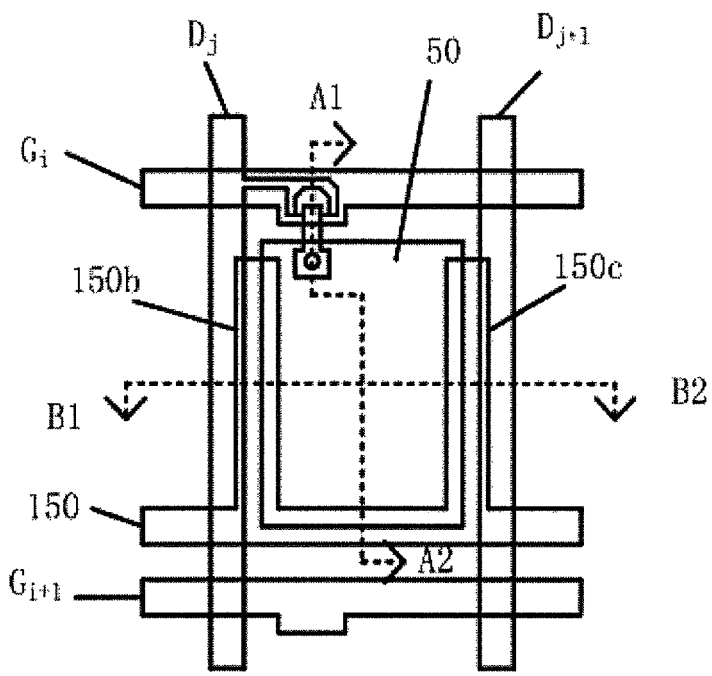
FIG. 13 is a schematic view for a pixel unit in the array substrate of FIG. 12.
Figure 14:
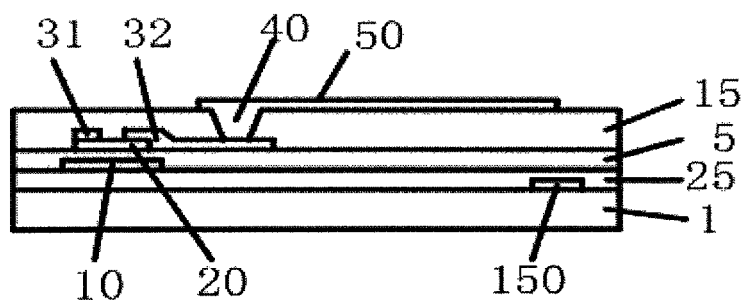
FIG. 14 is a cross-sectional view along A1-A2 of FIG. 12.
Figure 15:
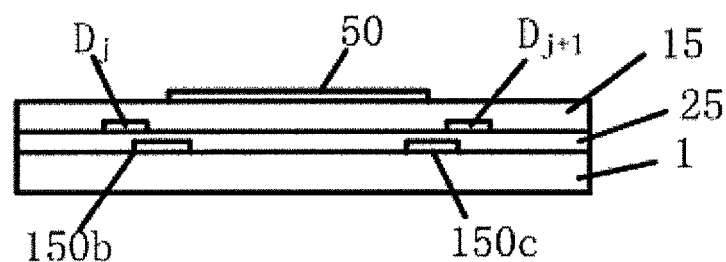
FIG. 15 is a cross-sectional view along B1-B2 of FIG. 12.

As shown in FIG. 13, in this embodiment, each pixel unit comprises a thin film transistor, wherein the source 31 of the thin film transistor is connected with the data lines, the drain 32 is connected with the pixel electrodes 50, and the gate 10 is connected with the gate lines. As shown in FIG. 14 and FIG. 15, the array substrate comprises the following layers. The common electrode lines 150 are arranged on the substrate 1. The first insulating layer 25 is arranged on the common electrode lines 150. The gate lines and the gate 10 are arranged on the first insulating layer 25. The gate insulating layer 5 is arranged on the gate lines and the gate 10. The active layer 20 is arranged on the gate insulating layer 5. The source 31 and the drain 32 are arranged on the active layer 20. The passivation layer 15 is arranged on the source 31 and the drain 32. The pixel electrodes 50 are arranged on the passivation layer 15. The pixel electrodes 50 are connected with the drain 32 of the thin film transistor by means of the via hole 40. The via hole 40 is arranged in the passivation layer 15, and partially exposes the drain 32 of the thin film transistor. As can be seen, the branches 150b, 150c of one of the common electrode lines 150 are located below a layer in which the data lines Dj, Dj+1 lie, i.e., the layer in which the common electrode lines lie is located below the layer in which the data lines lie.

It is noted that in this embodiment, the passivation layer 25 can be absent between the pixel electrode 50 and the layer in which the source 31 and the drain 32 lie, while the pixel electrode 50 is arranged on the gate insulating layer 5. In this case, the pixel electrode 50 can be directly connected with the drain 32.

In a variation of the present embodiment, the array substrate has a structure substantially identical to that of the above-mentioned array substrate. The difference lies in that, in the array substrate of the present embodiment, the layer in which the common electrode lines 150 lie is located between the layer in which the data lines lie and the layer in which the pixel electrode 50 lies.

In particular, the branches 150b, 150c of one of the common electrode lines 150 are arranged between the layer in which the data lines Dj, Dj+1 lie and the layer in which the pixel electrode 50 lies. Projections of the branches 150b, 150c on the substrate 1 partially overlap projections of the data lines Dj, Dj+1 on the substrate 1 respectively, and partially overlap the projection of the pixel electrode 50 on the substrate 1.

In another variation of the present embodiment, the array substrate has a structure substantially identical to that of the above-mentioned array substrate. The difference lies in that, in the array substrate of the present embodiment, the layer in which the common electrode lines 150 lie is located above the layer in which the pixel electrode 50 lies.

In particular, the branches 150b, 150c of one of the common electrode lines 150 are arranged above the layer in which the pixel electrode 50 lies. Projections of the branches 150b, 150c on the substrate 1 partially overlap projections of the data lines Dj, Dj+1 on the substrate 1 respectively, and partially overlap the projection of the pixel electrode 50 on the substrate 1.

In yet another variation of the present embodiment, the gate lines and the common electrode lines 150 of the array substrate are not arranged in a same layer. The array substrate differs from the above array substrate in that, two neighboring common electrode lines are connected into an integral structure by respective branch of one the two common electrode lines which extends in the data line direction.

Embodiment 6

The present embodiment provides a display device, which comprises the array substrate in any one of embodiments 1-5.

The display device can be a liquid crystal display device or an electroluminescence display device, and can be any product or component with a display function, such as a liquid crystal panel, electron paper, mobile phone, tablet computer, TV, monitor, notebook computer, digital photo frame, and navigator.

The display device of this embodiment has excellent display quality.

Although the present invention has been described above with reference to specific embodiments, it should be understood that the limitations of the described embodiments are merely for illustrative purpose and by no means limiting. Instead, the scope of the invention is defined by the appended claims rather than by the description, and all variations that fall within the range of the claims are intended to be embraced therein. Thus, other embodiments than the specific ones described above are equally possible within the scope of these appended claims.

The invention claimed is:

1. An array substrate, comprising a plurality of gate lines, a plurality of data lines which intersect the plurality of gate lines, and a plurality of pixel units defined by neighboring gate lines and neighboring data lines, each pixel unit comprises a pixel electrode, wherein
the array substrate further comprises a plurality of common electrode lines extending in a gate line direction, each of the common electrode lines comprises a plurality of branches extending in a data line direction;
each branch corresponds to one of the data lines and at least one pixel electrode, a projection of each branch on the substrate at least partially overlaps a projection of the data line to which the branch corresponds on the substrate, and partially overlaps a projection of the pixel electrode to which the branch corresponds on the substrate;
and wherein a layer in which the pixel electrodes lie is located above the layer in which the data lines lie, and a layer in which the common electrode lines lie is located below a layer in which the data lines lie.

2. The array substrate of claim 1, wherein a projection of at least one of the branches on the substrate partially overlaps projections of two neighboring pixel electrodes in a same row on the substrate, respectively, and completely overlaps a projection of the data line between said two neighboring pixel electrodes on the substrate.

3. The array substrate of claim 1, wherein a projection of each branch on the substrate partially overlaps a projection of the pixel electrode to which the branch corresponds on the substrate, and partially overlaps a projection of the data line to which the branch corresponds on the substrate.

4. The array substrate of claim 1, wherein the common electrode lines and the gate lines are arranged in a same layer and made from a same material.

5. A display device, wherein an array substrate comprises an array substrate, comprising a plurality of gate lines, a plurality of data lines which intersect the plurality of gate lines, and a plurality of pixel units defined by neighboring gate lines and neighboring data lines, each pixel unit comprises a pixel electrode, wherein
the array substrate further comprises a plurality of common electrode lines extending in a gate line direction, each of the common electrode lines comprises a plurality of branches extending in a data line direction;
each branch corresponds to one of the data lines and at least one pixel electrode, a projection of each branch on the substrate at least partially overlaps a projection of the data line to which the branch corresponds on the substrate, and partially overlaps a projection of the pixel electrode to which the branch corresponds on the substrate;
and wherein a layer in which the pixel electrodes lie is located above the layer in which the data lines lie, and a layer in which the common electrode lines lie is located below a layer in which the data lines lie.

6. The display device of claim 5, wherein a projection of at least one of the branches on the substrate partially overlaps projections of two neighboring pixel electrodes in a same row on the substrate, respectively, and completely overlaps a projection of the data line between said two neighboring pixel electrodes on the substrate.

7. The display device of claim 5, wherein a projection of each branch on the substrate partially overlaps a projection of the pixel electrode to which the branch corresponds on the substrate, and partially overlaps a projection of the data line to which the branch corresponds on the substrate.

8. The display device of claim 5, wherein the common electrode lines and the gate lines are arranged in a same layer and made from a same material.

* * * * *